(12) United States Patent
Okami

(10) Patent No.: US 7,894,148 B2
(45) Date of Patent: Feb. 22, 2011

(54) ABSORPTION TYPE MULTI-LAYER FILM ND FILTER AND PROCESS FOR PRODUCING THE SAME

(75) Inventor: Hideharu Okami, Chiba (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 386 days.

(21) Appl. No.: 12/085,863

(22) PCT Filed: Jan. 18, 2007

(86) PCT No.: PCT/JP2007/051116

§ 371 (c)(1),
(2), (4) Date: May 30, 2008

(87) PCT Pub. No.: WO2007/083833

PCT Pub. Date: Jul. 26, 2007

(65) Prior Publication Data

US 2009/0080098 A1    Mar. 26, 2009

(30) Foreign Application Priority Data

Jan. 20, 2006    (JP) .............................. 2006-012320

(51) Int. Cl.
*G02B 5/22*    (2006.01)
*G02B 1/10*    (2006.01)

(52) U.S. Cl. ........................ 359/888; 359/586
(58) Field of Classification Search ........... 359/885
See application file for complete search history.

(56) References Cited

U.S. PATENT DOCUMENTS

| 5,715,103 | A | 2/1998 | Amano et al. |
| 7,388,723 | B2 * | 6/2008 | Kunii .................... 359/888 |
| 7,440,204 | B2 * | 10/2008 | Kunii .................... 359/888 |
| 2003/0026014 | A1 | 2/2003 | Kunii |

FOREIGN PATENT DOCUMENTS

| JP | 5-93811 | 4/1993 |
| JP | 3359114 | 10/2002 |
| JP | 2003-43211 | 2/2003 |
| JP | 2003-322709 | 11/2003 |
| WO | WO 01/27345 A1 | 4/2001 |
| WO | WO 2004/011690 A1 | 2/2004 |
| WO | WO 2005/047940 A1 | 5/2005 |

* cited by examiner

*Primary Examiner*—Arnel C Lavarias
*Assistant Examiner*—Jade R Chwasz
(74) *Attorney, Agent, or Firm*—Kratz, Quintos & Hanson, LLP

(57) ABSTRACT

An absorption type multi-layer film ND filter having a substrate formed of a resin film and on at least one side thereof an absorption type multi-layer film of oxide dielectric film layers and absorption film layers which are alternately wherein the oxide dielectric film layers are each a SiCyOx ($0<y\leq0.1$, $1.5<x<2$) film having an extinction coefficient at a wavelength of 550 nm of 0.005 to 0.05, formed by a physical vapor deposition process using a film-forming material composed chiefly of SiC and Si, and the absorption film layers are each a metal film having a refractive index at a wavelength of 550 nm of 1.5 to 3.0 and an extinction coefficient at that wavelength of 1.5 to 4.0, formed by a physical vapor deposition process; an outermost layer of the multi-layer film being one oxide dielectric film layer of SiCyOx.

10 Claims, 3 Drawing Sheets

ND FILTER SPECTRAL TRANSMISSION CHARACTERISTICS

ND FILTER SPECTRAL TRANSMISSION CHARACTERISTICS

SPECTRAL TRANSMISSION CHARACTERISTICS

ND FILTER SPECTRAL TRANSMISSION CHARACTERISTICS

ABSORPTION TYPE MULTI-LAYER FILM ND FILTER AND PROCESS FOR PRODUCING THE SAME

TECHNICAL FIELD

This invention relates to an absorption type multi-layer film ND filter which attenuates transmitted light in the visible spectral range. More particularly, it relates to an absorption type multi-layer film ND filter having a superior environmental resistance which makes use of a resin film as a substrate, and a process for producing the same.

BACKGROUND ART

As ND filters (neutral density filters), a reflection type ND filter which reflects incident light to attenuate it and an absorption type ND filter which absorbs incident light to attenuate it are known in the art. Then, where an ND filter is set in a lens optical system in which the reflected light comes into question, the absorption type ND filter is commonly used. This absorption type ND filter includes a type in which the substrate itself is incorporated with an absorptive substance (a color glass ND filter) or coated with it, and a type in which the substrate itself does not absorb light and a thin film formed on its surface does. Also, in the case of the latter, in order to prevent reflection at the thin-film surface, the thin film is constituted of a multiple layer (an absorption type multi-layer film) so that it can have the function to attenuate transmitted light and also have the effect of preventing the reflection.

Now, in an absorption type multi-layer film ND filter used in compact thin-type digital cameras, its substrate itself must be thin because the camera has a narrow set-in space. Accordingly, a resin film is used as an optimum substrate.

As the absorption type multi-layer film ND filter whose thin film is constituted of a multiple layer, Japanese Patent Application Laid-open No. H05-93811 discloses an ND filter consisting of an oxide dielectric film layer and a metal layer, where the metal layer is used as an absorption film layer.

An ND filter is also known in which, as the absorption film layer, a metal oxide film of TiOx, $Ta_2Ox$ or the like is employed at the time of film formation of which oxygen is intentionally fed in to make it have absorption due to oxygen deficiency.

Here, where the absorption film layer is made up of the metal film at the time of film formation of which oxygen is not intentionally fed in, such a metal film has a higher extinction coefficient (absorptivity coefficient) than the metal oxide film of TiOx, $Ta_2Ox$ or the like, and hence, in order to achieve the like extinction coefficient, the employment of the metal layer enables formation of the absorption film layer in a smaller layer thickness.

Then, where the absorption type multi-layer film is formed on a resin film substrate having a flexibility, it is more advantageous to employ as the absorption film layer such a metal layer that enables its layer thickness to be set smaller than that of the metal oxide film, taking account of warpage of the resin film substrate, cracking of films, time for film formation, and so forth.

However, the metal film and the metal oxide film of TiOx, $Ta_2Ox$ or the like not completely oxidized may easily proceed with oxidation to come to have a low extinction coefficient, and hence an ND filter employing the metal film or the metal oxide film not completely oxidized comes to have a higher transmittance with time, as so known in the art. This has been remarkable especially in the case of the metal film.

Thus, in the ND filter employing the metal film or the metal oxide film not completely oxidized, it has come into question that the absorption film layer proceeds with oxidation in a high-temperature and high-humidity environment to come to increase in its transmittance.

Now, the oxygen that oxidizes the metal film or the metal oxide film not completely oxidized is considered to be fed from the atmosphere or from the resin film substrate or the oxide dielectric film layer. In particular, the metal layer tends to be affected by the oxidation if it is 10 nm or less in thickness.

Accordingly, in order to prevent oxidation of the metal film or the like, a method is proposed in which heat treatment is carried out in the atmosphere or in an atmosphere of oxygen so as to oxidize the metal film or the like at its interface and in the vicinity thereof, and not to oxidize the metal film or the like up to its interior. For example, in Japanese Patent Application Laid-open No. 2003-43211, a thin-film ND filter is proposed in which a light absorbing film and a dielectric film are formed on a transparent substrate in layers, where as the light absorbing film a light absorbing film containing a metallic-material oxide TiOx is used which is formed by vacuum deposition using a metallic material Ti as a raw material, and by feeding at the time of film formation a mixed gas containing oxygen and in the state the degree of vacuum is kept constant between $1\times10^{-3}$ Pa and $1\times10^{-2}$ Pa. Then, the light absorbing film and the dielectric film are formed on the transparent substrate in layers, and thereafter these are heated in an atmosphere of oxygen containing 10% or more of oxygen to make any changes in optical characteristics saturated. In Japanese Patent Application Laid-open No. 2003-322709, a method is also proposed in which, in regard to a thin-film ND filter in which at least one transparent dielectric film and light absorbing film are formed on a light-transmitting substrate in layers, a lower metal nitride film layer that can not easily come to have a high transmittance as a result of oxidation is employed as the light absorbing film.

Now, the above method in which heat treatment is carried out in the atmosphere or in an atmosphere of oxygen so as to oxidize the metal film or the like at its interface and in the vicinity thereof has had a problem that the oxidation may completely proceed up to its interior especially in the case of a thin metal film of 10 nm or less in thickness to make it difficult to form an oxide film only at the interface and in the vicinity thereof. In the case when the heat treatment is carried out in the atmosphere or in an atmosphere of oxygen, it has also come about that the film comes to warp or crack because of a difference in coefficient of thermal expansion between the absorption type multi-layer film formed and the resin film substrate. Further, as the substrate resin film, a film of continuous length is usually used. Accordingly, there has been a problem that very large-scale equipment is required in order to carry out uniform heat treatment while a resin film on which the absorption type multi-layer film has been formed by means of, e.g., a sputtering roll coater is wound up around a wind-up roll.

The method employing the lower metal nitride film layer that can not easily come to have a high transmittance as a result of oxidation has resolved the disadvantage of coming to increase in transmittance, but has had a problem that the lower metal nitride film layer has a large layer thickness because of its smaller extinction coefficient than the metal film layer.

The present invention has been made taking note of such problems, and a subject of the present invention is to provide an absorption type multi-layer film ND filter having a superior environmental resistance which makes use of a resin film as a substrate, and a process for producing the same.

Accordingly, the present inventor has made extensive studies in order to resolve the above subject. As the result, he has come to discover such a means for resolution as described below.

First, when the metal film constituting the absorption film layer of the absorption type multi-layer film is oxidized in a high-temperature and high-humidity environment, oxygen is fed from the oxide dielectric film layer of the absorption type multi-layer film. Accordingly, the metal film can be kept from proceeding with oxidation if the level of oxygen contained in the oxide dielectric film layer is made lower so that the oxygen can not easily be fed. However, the oxide dielectric film layer may slightly be colored unless it stands oxidized sufficiently, and hence it can not be used in any reflection preventive films, reflecting films and so forth required to be transparent films.

However, a metal film having absorption at first is used in the absorption type multi-layer film ND filter, and hence it does not especially come into question if the oxide dielectric film layer stands slightly colored and has absorption.

It is then considered that, as long as the oxide dielectric film layer has absorption only slightly, it is unnecessary to take account of the extinction coefficient of the oxide dielectric film layer when the absorption type multi-layer film is film-designed and, if on the other hand the absorption of the oxide dielectric film layer is so large as to greatly affect the transmittance of the ND filter, the extinction coefficient of the oxide dielectric film layer may be taken into account when the absorption type multi-layer film is film-designed. The present invention has been accomplished through such technical studies.

DISCLOSURE OF THE INVENTION

That is, the absorption type multi-layer film ND filter according to the present invention is an absorption type multi-layer film ND filter comprising a substrate formed of a resin film and provided on at least one side thereof an absorption type multi-layer film formed of oxide dielectric film layers and absorption film layers which are alternately formed in layers, wherein;

the oxide dielectric film layers are each constituted of an $SiC_yO_x$ ($0<y\leq0.1$, $1.5<x<2$) film having an extinction coefficient at a wavelength of 550 nm of from 0.005 to 0.05, formed by a physical vapor deposition process making use of a film-forming material composed chiefly of SiC and Si, and the absorption film layers are each constituted of a metal film having a refractive index at a wavelength of 550 nm of from 1.5 to 3.0 and an extinction coefficient at that wavelength of from 1.5 to 4.0, formed by a physical vapor deposition process; an outermost layer of the absorption type multi-layer film being constituted of one oxide dielectric film layer formed of the $SiC_yO_x$ film.

The process for producing an absorption type multi-layer film ND filter according to the present invention is a process for producing the absorption type multi-layer film ND filter described above; the process comprising the steps of:

forming an oxide dielectric film layer constituted of an $SiC_yO_x$ ($0<y\leq0.1$, $1.5<x<2$) film having an extinction coefficient at a wavelength of 550 nm of from 0.005 to 0.05, by a physical vapor deposition process making use of a film-forming material composed chiefly of SiC and Si and the feed rate of oxygen gas in which has been controlled; and forming an absorption film layer constituted of a metal film having a refractive index at a wavelength of 550 nm of from 1.5 to 3.0 and an extinction coefficient at that wavelength of from 1.5 to 4.0, by a physical vapor deposition process in which oxygen gas has been stopped to be fed in.

In the absorption type multi-layer film ND filter according to the present invention, as described above the oxide dielectric film layers are each constituted of an $SiC_yO_x$ ($0<y\leq0.1$, $1.5<x<2$) film having an extinction coefficient at a wavelength of 550 nm of from 0.005 to 0.05, formed by a physical vapor deposition process making use of a film-forming material composed chiefly of SiC and Si. The $SiC_yO_x$ ($0<y\leq0.1$, $1.5<x<2$) film constituting the oxide dielectric film layers has gas barrier properties superior to any conventional oxide dielectric film layers constituted of $SiO_2$ or the like, and also the $SiC_yO_x$ film itself is, because of shortage of oxygen, in the state it can not easily feed oxygen to the absorption film layers made up of metal films, as so considered.

Accordingly, this enables control of a phenomenon that the absorption film layers made up of metal films are oxidized with time in a high-temperature and high-humidity environment.

In the process for producing the absorption type multi-layer film ND filter according to the present invention, each oxide dielectric film layer is formed by a physical vapor deposition process the feed rate of oxygen gas in which has been controlled. Hence, this can make the film-forming rate of the oxide dielectric film layer higher than any conventional production processes in which oxygen is fed therein in a large quantity. Moreover, the SiC constituting part of the film-forming material in the oxide dielectric film layer has a high thermal conductivity and a superior cooling efficiency. This makes a large electric power applicable to a film-forming means of a physical vapor deposition system, and hence can make the film-forming rate of the oxide dielectric film layer much higher.

BEST MODES FOR PRACTICING THE INVENTION

Figure 1:
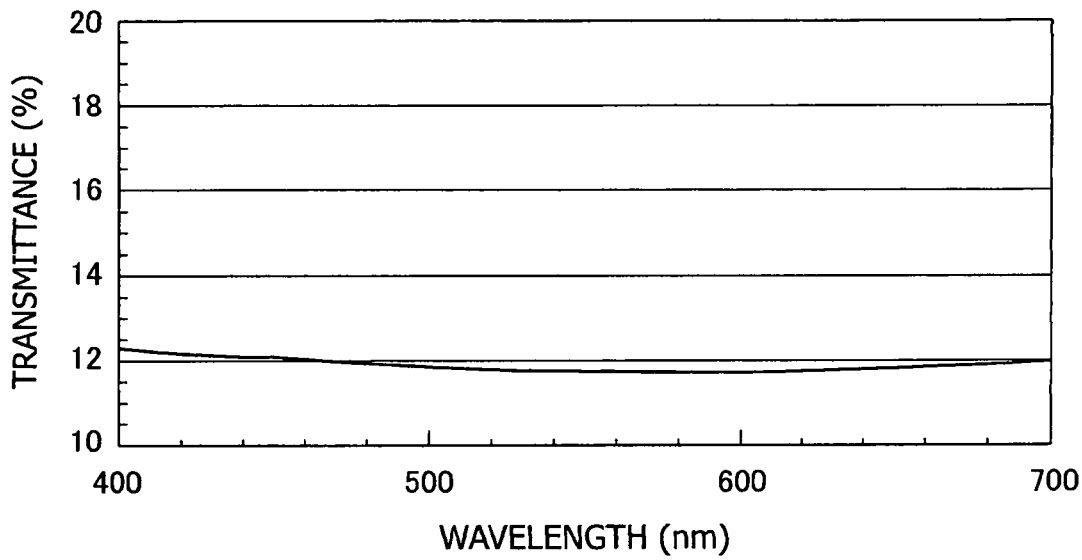
FIG. 1 is a graph showing spectral transmission characteristics of an absorption type multi-layer film ND filter according to Example 1.

The absorption type multi-layer film ND filter according to the present invention and the process for producing the same are described below in detail.

First, the absorption type multi-layer film ND filter according to the present invention is premised on an absorption type multi-layer film ND filter comprising a substrate formed of a resin film and provided on at least one side thereof an absorption type multi-layer film formed of oxide dielectric film layers and absorption film layers which are alternately formed in layers, and is characterized in that the oxide dielectric film layers are each constituted of an SiCyOx ($0<y\leq0.1$, $1.5<x<2$) film having an extinction coefficient at a wavelength of 550 nm of from 0.005 to 0.05, formed by a physical vapor deposition process making use of a film-forming material composed chiefly of SiC and Si, and the absorption film layers are each constituted of a metal film having a refractive index at a wavelength of 550 nm of from 1.5 to 3.0 and an extinction coefficient at that wavelength of from 1.5 to 4.0, formed by a physical vapor deposition process, and that an outermost layer of the absorption type multi-layer film is constituted of one oxide dielectric film layer formed of the SiCyOx film.

Here, the oxide dielectric film layers are each required to be constituted of the SiCyOx ($0<y\leq0.1$, $1.5<x<2$) film having an extinction coefficient at a wavelength of 550 nm of from 0.005 to 0.05, formed by a physical vapor deposition process making use of a film-forming material composed chiefly of SiC and Si and the feed rate of oxygen gas in which has been controlled. The physical vapor deposition process may include vacuum deposition, ion beam sputtering, magnetron sputtering and ion plating.

In order to control the feeding of oxygen from the resin film substrate to the absorption type multi-layer film, it is desirable that the film coming into contact with the resin film substrate, of the absorption type multi-layer film is constituted of one oxide dielectric film layer formed of the SiCyOx film.

It is also desirable for the oxide dielectric film layers to each have a layer thickness of from 3 nm to 150 nm. This is because, if each oxide dielectric film layer has a layer thickness of less than 3 nm, such a layer not only may less contribute as an optical thin film but also may make it difficult to control the layer thickness, and further because it may make it difficult to control the phenomenon that the absorption film layers are oxidized to come to increase in transmittance in a high-temperature and high-humidity environment. If on the other hand each oxide dielectric film layer has a layer thickness of more than 150 nm, such a thick layer is no longer necessary for the designing of optical thin films at the wavelength of 550 nm, and is also undesirable in view of production efficiency.

Next, the absorption film layers are each required to be constituted of the metal film having a refractive index at a wavelength of 550 nm of from 1.5 to 3.0 and an extinction coefficient at that wavelength of from 1.5 to 4.0, formed by a physical vapor deposition process in which oxygen gas has been stopped to be fed in. Here, the metal film formed without feeding any oxygen intentionally at the time of film formation has a higher extinction coefficient than metal oxide films of TiOx, $Ta_2Ox$ or the like having absorption due to oxygen deficiency, formed by feeding oxygen intentionally at the time of film formation. Then, when the oxide dielectric film layers and the absorption film layers are alternately formed in layers on the resin film substrate having a flexibility, to form the absorption type multi-layer film, and taking account of warpage of the resin film substrate, cracking of films, time for film formation, and so forth, it is preferable to employ the above metal film having a high extinction coefficient, because it can be formed in a smaller layer thickness than the metal oxide film in order to achieve the like extinction coefficient.

However, the metal film is known to proceed easily with oxidation to have a low extinction coefficient, resulting in a high transmittance in the ND filter. Accordingly, in the present invention, the SiCyOx ($0<y\leq0.1$, $1.5<x<2$) film having an extinction coefficient at a wavelength of 550 nm of from 0.005 to 0.05, formed by a physical vapor deposition process making use of a film-forming material composed chiefly of SiC and Si is employed as each oxide dielectric film layer adjoining to this metal film, whereby the metal film constituting each absorption film layer is kept from being oxidized. As described above, the metal film is formed by the physical vapor deposition process in which oxygen gas has been stopped to be fed in, where the metal film may slightly be oxidized by oxygen gas remaining slightly in the physical vapor deposition system because of the film formation of the oxide dielectric film layer. However, it may be used as the metal film as long as it is oxidized to a very lower extent than the metal oxide film of TiOx, $Ta_2Ox$ or the like having absorption due to oxygen deficiency, and fulfills the requirement that it has a refractive index at a wavelength of 550 nm of from 1.5 to 3.0 and an extinction coefficient at that wavelength of from 1.5 to 4.0. The absorption film layers each constituted of the metal film having a refractive index at a wavelength of 550 nm of from 1.5 to 3.0 and an extinction coefficient at that wavelength of from 1.5 to 4.0, formed by a physical vapor deposition process, may each preferably have a layer thickness of from 3 nm to 20 nm.

The metal film constituting each absorption film layer may preferably be composed of Ni alone or a Ni-based alloy. This is because, although metallic materials used as absorption film layers of optical thin films all tend to be oxidized to have a low extinction coefficient, the Ni alone or Ni-based alloy is a metal that can relatively be not easily oxidized. In particular, the Ni-based alloy may preferably be a Ni-based alloy formed by adding to Ni at least one element selected from Ti, Al, V, W, Ta and Si. To state the reason therefor briefly, it is as follows:

That is, a pure Ni material is a ferromagnetic material, and hence, where the metal film is formed by direct-current magnetron sputtering making use of a Ni material (a target), the magnetic force coming from a magnet provided on the back of the target in order to make it act on plasma generated between the target and a substrate is shielded with the Ni target material to weaken the magnetic field leaking to the surface, so that it may become difficult to form the film in a good efficiency while concentrating the plasma. To avoid this, it is preferable that a cathode (a ferromagnetic-field cathode) in which the magnetic force of a magnet provided on the back of the target has been made stronger (400 gausses or more) is used so as to make stronger the magnetic field passing through the Ni target, to form the film by sputtering. However, even when such a method is employed, another problem as stated below may come abut at the time of production. That is, with a decrease in thickness of the target with continuous use of the Ni target, the leakage magnetic field in the plasma space becomes stronger at the part where the target has become smaller in thickness. Then, where the leakage magnetic field in a plasma space has become stronger, discharge characteristics (such as discharge voltage and discharge current) change to cause a change in film formation rate. That is to say, continuous use of the same Ni target for a long time at the time of production causes a problem that the film formation rate of the Ni film changes with consumption of the Ni target, to make it difficult to produce absorption type multi-layer film ND filters having uniform characteristics. To avoid this problem, as described above, the metal film may be made up of the Ni-based alloy formed by adding to Ni at least one element selected from Ti, Al, V, W, Ta and Si.

It is preferable to use, e.g., a Ni-based alloy containing the Ti element in the range of from 5% by weight to 15% by weight. The reason why the lower limit of Ti content is set to be 5% by weight is that incorporating it in a content of 5% by weight or more can extremely weaken the ferromagnetic characteristics, and this enables the film to be formed by direct-current magnetron sputtering even with use of a cathode provided with a usual magnet having a low magnetic force. Another reason therefor is that the ability to shield the magnetic field by the target is so low as to also cause only small changes in the leakage magnetic field in a plasma space that depend on the consumption of the target, so that a constant film formation rate can be maintained and the film can stably be formed. The reason why the upper limit of Ti content is set to be 15.0% by weight is that, if Ti is incorporated in a content of more than 15.0% by weight, there is a possibility that an intermetallic compound may inevitably be formed in a large quantity.

The amount of the Al element, V element, W element, Ta element or Si element may also be determined for the like reasons. Where any of these Al element, V element, W element, Ta element and Si element is added, it is preferable to use a Ni-based alloy formed by adding to Ni the Al element in a proportion of from 3% by weight to 8% by weight, the V element in a proportion of from 3% by weight to 9% by weight, the W element in a proportion of from 18% by weight to 32% by weight, the Ta element in a proportion of from 5% by weight to 12% by weight and/or the Si element in a proportion of from 2% by weight to 6% by weight.

Now, in order to design the film make-up of the ND filter, it is necessary to know optical constants (such as refractive index and extinction coefficient) of the oxide dielectric film layer and absorption film layer. To measure these optical constants, spectral ellipsometry and spectral interferometry are available. As stated above, films using as raw materials the metals used in the absorption film layers may inevitably proceed with oxidation as soon as they are exposed to the atmosphere after film formation, and hence the measured values of optical constants that have found when the ND film is made up may greatly differ from the optical constants measured only on an absorption film layer (single layer). Accordingly, it is ideal that the optical constants of the oxide dielectric film layers and absorption film layers are measured in the state the ND film has been made up, where the film make-up of the ND filter is once again designed on the basis of the optical constants found here and this is repeated to find out an optimum film make-up.

Next, the process for producing the absorption type multi-layer film ND filter according to the present invention is premised on a process for producing the absorption type multi-layer film ND filter comprising a substrate formed of a resin film and provided on at least one side thereof the absorption type multi-layer film formed of oxide dielectric film layers and absorption film layers which are alternately formed in layers, and is characterized in that the process comprising the steps of:

forming an oxide dielectric film layer constituted of an SiCyOx (0<y≦0.1, 1.5<x<2) film having an extinction coefficient at a wavelength of 550 nm of from 0.005 to 0.05, by a physical vapor deposition process making use of a film-forming material composed chiefly of SiC and Si and the feed rate of oxygen gas in which has been controlled; and forming an absorption film layer constituted of a metal film having a refractive index at a wavelength of 550 nm of from 1.5 to 3.0 and an extinction coefficient at that wavelength of from 1.5 to 4.0, by a physical vapor deposition process in which oxygen gas has been stopped to be fed in.

Here, as the film-forming material (target) composed chiefly of SiC and Si, any material may be used as long as it is a film-forming material composed chiefly of SiC and Si.

For example, it may include a sputtering target constituted of a material containing SiC and Si and having a volume ratio of SiC of from 50% to 70% where volume ratio (%) of SiC=[total volume of SiC/(total volume of SiC+total volume of Si)]×100 (see International Publication: WO 2004/011690 Publication); and a sputtering target which is obtained by i) molding a carbon (C) powder by cast molding or press molding or shaping it by extrusion and ii) impregnating Si into the resultant molded or extruded product which Si has been melted at a temperature of from 1,450° C. or more to 2,200° C. or less in a vacuum or in a reduced-pressure non-oxidizing atmosphere, to fill voids of the molded or extruded product with metallic Si, and which contains SiC and the metallic Si and has an atomic ratio of C to Si of from 0.5 or more to 0.95 or less (see International Publication: WO 01/027345 Publication).

Next, as an example of the absorption type multi-layer film ND filter according to the present invention, a film make-up of an absorption type multi-layer film ND filter having an average transmittance of 12.5% is shown in Table 1, and its spectral transmission characteristics are shown in FIG. 1.

TABLE 1

| Materials | Layer thickness |
|---|---|
| Medium (air) | — |
| SiCyOx | 65 nm |
| Ti | 15 nm |
| SiCyOx | 65 nm |
| Ti | 15 nm |
| SiCyOx | 10 nm |
| PET | — |

In this absorption type multi-layer film ND filter, the SiCyOx (0<y≦0.1, 1.5<x<2) film formed by magnetron sputtering which makes use of the film-forming material (target) composed chiefly of SiC and Si and the feed rate of oxygen gas in which has been controlled is used in each oxide dielectric film layer, and a Ti film, which is relatively easily oxidized, is used in each absorption film layer in order to confirm the effect of the present invention.

In regard to film-forming conditions for oxygen-deficient oxide dielectric film layers each constituted of the SiCyOx (0<y≦0.1, 1.5<x<2) film, the compositional analysis of the SiCyOx film involves technical difficulties, and hence the conditions are required to be controlled seeking film-forming conditions that fulfill the requirement that the SiCyOx films each finally have an extinction coefficient at a wavelength of 550 nm of from 0.005 to 0.05 as a result of measurement of its optical characteristics.

Next, in regard to the absorption film layers, the film-forming conditions therefor may differ depending on additives and impurities of the film-forming material, residual gasses at the time of film formation, gases released from the substrate, and the rate of film formation, and hence the absorption film layers to be obtained may greatly differ in their refractive index and extinction coefficient. Accordingly, the conditions are required to be controlled seeking film-forming conditions that fulfill the requirement that the absorption film layers obtained by forming the films by a physical vapor deposition process such as vacuum deposition, ion beam sputtering, magnetron sputtering or ion plating making use of a metal which is Ti as a film-forming material and in which oxygen gas has been stopped to be fed in are each constituted of the metal film having a refractive index at a wavelength of 550 nm of from 1.5 to 3.0 and an extinction coefficient at that wavelength of from 1.5 to 4.0. As the metal, usable besides the Ti are the Ni or Ni-based alloy described above, Cr, W, Ta, Nb and so forth.

In addition, in order to keep the absorption film layers from being oxidized, an outermost layer of the absorption type multi-layer film constituted of the oxide dielectric film layers and absorption film layers is required to be constituted of one oxide dielectric film layer formed of the SiCyOx ($0<y\leq0.1$, $1.5<x<2$) film. More preferably, as to the film coming into contact with the resin film substrate (PET), of the absorption type multi-layer film, too, it may be constituted of one oxide dielectric film layer formed of the SiCyOx ($0<y\leq0.1$, $1.5<x<2$) film (see Table 1).

Here, there are no particular limitations on a material for the resin film constituting the substrate, which, however, may preferably be what is transparent, and, taking account of mass productivity, may preferably be a flexible substrate which enables dry-process sputtering roll coating described later. Such a flexible substrate is also advantageous in that it is rich in inexpensiveness, lightness in weight and deformability, compared with any conventional glass substrates or the like. As specific examples of the resin film constituting the substrate, it may include a single member of a resin film selected from resin materials such as polyethylene terephthalate (PET), polyether sulfone (PES), polyarylate (PAR), polycarbonate (PC), polyolefin (PO) and norbornene, and a composite of the resin film single member selected from the above resin materials and an acrylic organic film with which one side or both side of the single member is/are covered. In particular, as to the norbornene resin material, it may include, as typical ones, ZEONOA (trade name), available from Nippon Zeon Co., Ltd., and ARTON (trade name), available from JSR Corporation.

The present invention is described below in greater detail by giving Examples.

Example 1

First, spectral optical characteristics relying on the oxygen feed rates were examined on oxide dielectric film layers each constituted of an SiCyOx ($0<y\leq0.1$, $1.5<x<2$) film obtained by using as a film-forming material a target composed chiefly of SiC and Si, using as a substrate a PET film of 100 μm in thickness which was slit in a width of 300 mm, and controlling the feed rate of oxygen gas at the time of film formation.

In the film formation, a sputtering roll coater system was used. The target composed chiefly of SiC and Si (where SiC:Si was 70-90%:30-10% in weight ratio) or a target composed of SiC with a high purity was used as the target for forming the oxide dielectric film layers.

A turbo molecular pump was used as an evacuation pump. Using the target composed chiefly of SiC and Si, sputtering was carried out by dual magnetron sputtering, and the feeding of oxygen therein was controlled by means of an impedance monitor. It shows that, when the impedance control preset value is the smaller, the oxygen is fed in the larger quantity.

Here, the dual magnetron sputtering is a sputtering process in which, in order to form insulating films at high rates, medium frequency (40 kHz) pulses are alternately applied to two targets to keep arcing from occurring so as to prevent any insulating layer from being formed on the target surfaces.

The impedance monitor is used in order to form the oxide dielectric film layers at high rates while controlling and monitoring oxygen feed rates so that films to be formed can be films of a desired mode which is in a transition region between a metal mode and an oxide mode, applying a phenomenon in which the impedance between target electrodes changes depending on the oxygen feed rate.

The films obtained by forming films using the target composed chiefly of SiC and Si come to change from an SiCy film (only in the case of a fairly high vacuum) to an SiCyOx film and further to an $SiO_2$ film as the oxygen partial pressure at the time of film formation becomes higher (the oxygen feed rate at the time of film formation becomes larger).

Figure 2:
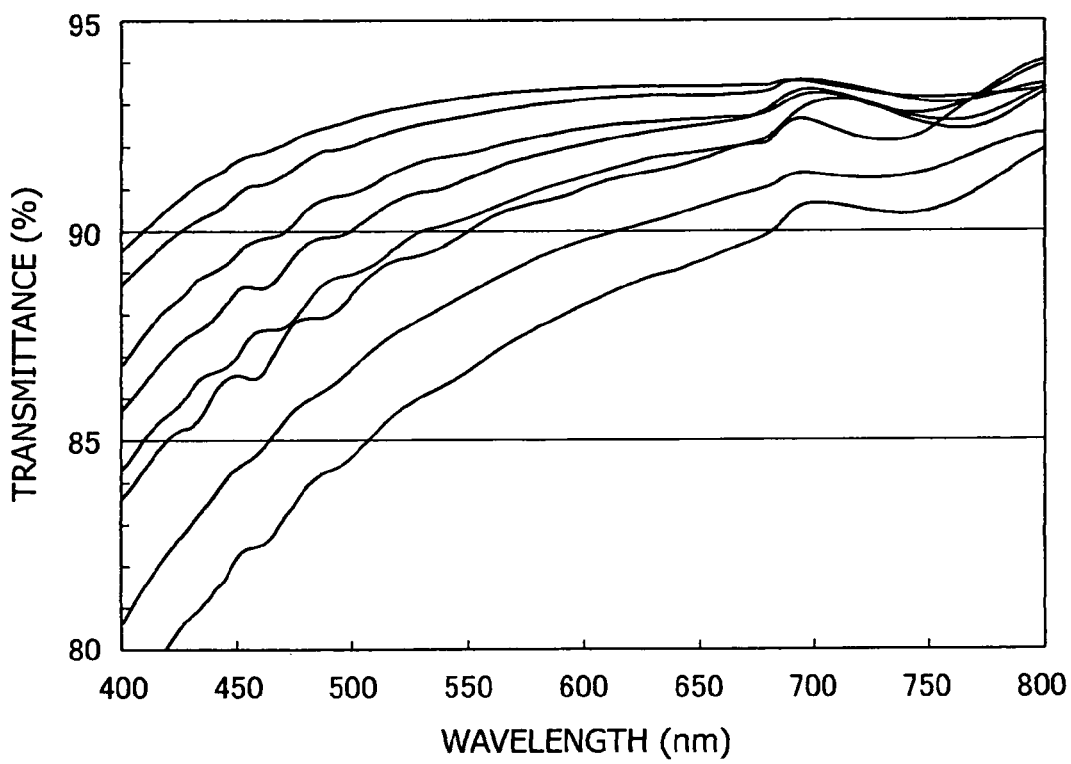
FIG. 2 is a graph showing spectral transmission characteristics of $SiC_yO_x$ films obtained correspondingly to impedance control preset values when the $SiC_yO_x$ ($0<y\leq0.1$, $1.5<x<2$) film is formed which constitutes the oxide dielectric film layers of the absorption type multi-layer film ND filter according to the present invention.

Spectral transmission characteristics of SiCyOx ($0<y\leq0.1$, $1.5<x<2$) films formed setting impedance control preset values at 36, 38, 40, 42, 44, 46, 48 and 49 are shown in FIG. 2. In what are shown in FIG. 2, the SiCyOx films formed become higher in transmittance at a wavelength of 550 nm, correspondingly to the order of the impedance control preset values 36, 38, 40, 42, 44, 46, 48 and 49 (that is, an SiCyOx film formed setting the impedance control preset value at 36 is highest in transmittance at a wavelength of 550 nm, and an SiCyOx film formed setting the impedance control preset value at 49 is lowest in transmittance at a wavelength of 550 nm). The substrate is made of polyethylene terephthalate (PET), and each SiCyOx film is about 450 nm in physical layer thickness. Impedance control preset values at the time of SiCyOx film formation, cathode voltages at the time of 4 kW input and extinction coefficients of SiCyOx films are respectively shown in Table 2.

The SiCyOx film looks completely transparent in visual observation when the impedance control preset value at the time of film formation is 38 or less. Further, when the impedance control preset value is 45 rather than 35, the rate of film formation at the time of 4 kW input is improved by about 30%, and hence the film formation time (or production cost) can be expected to be reduced.

When the impedance control preset value is 36 or less, the SiCyOx film looks transparent in visual observation, and hence the film is judged allowable to consider that it is an $SiO_2$ film.

In the case of usual film formation, it is said that the C of SiCyOx almost comes into CO or $CO_2$ to come exhausted and the C comes less than 0.5 at %, which is the analysis limit or less. In comparing impedance control preset values 38, 40 and 43, it is presumed that the SiC has increased in a trace quantity.

In regard to the absorption of each SiCyOx ($0<y\leq0.1$, $1.5<x<2$) film, it has not still been ascertained whether the absorption is due to such a trace of SiC or it is due to oxygen shortage in $SiO_2$. Where a Si target containing no SiC is used, the $SiO_2$ exhibits absorption even under very slight oxygen deficiency, but any method for making analysis in detail has not still been found out.

TABLE 2

| Impedance control preset value | Cathode voltage (V) | Extinction coefficient of SiCyOx film at wavelength of 550 nm |
|---|---|---|
| 35 | 869 | <0.001 |
| 36 | 634 | 0.002 |
| 37 | 657 | 0.005 |
| 38 | 673 | 0.006 |
| 39 | 691 | 0.008 |
| 40 | 709 | 0.010 |
| 41 | 726 | 0.013 |
| 42 | 744 | 0.016 |
| 43 | 762 | 0.020 |
| 44 | 780 | 0.024 |
| 45 | 798 | 0.028 |
| 46 | 815 | 0.033 |
| 47 | 833 | 0.038 |
| 48 | 850 | 0.044 |
| 49 | 869 | 0.050 |

Thus, in regard to the oxide dielectric film layers, the oxide dielectric film layers each having an extinction coefficient at a wavelength of 550 nm of from 0.005 to 0.05 can be obtained by using as a film-forming material the target composed chiefly of SiC and Si, forming the films by the physical vapor deposition process such as vacuum deposition, ion beam sputtering, magnetron sputtering or ion plating, and reducing the oxygen gas to be fed in at the time of film formation while controlling the oxygen feed rate during film formation by means of the impedance monitor.

Under conditions in this Example, in order to form the SiCyOx (0<y≦0.1, 1.5<x<2) films each having an extinction coefficient at a wavelength of 550 nm of from 0.005 to 0.05 by using the target composed chiefly of SiC and Si, the impedance control preset values may be set at from 37 to 49 as shown in Table 2. If the SiCyOx films have an extinction coefficient of more than 0.05, it is difficult to achieve spectral transmission characteristics which are flat over the visible wavelength region (the difference in transmittance in the visible region is within about 1.5%). In particular, in order to achieve flat spectral transmission characteristics, it is desirable for the SiCyOx films to each have an extinction coefficient of 0.03 or less. In order to obtain SiCyOx films having such flat spectral transmission characteristics, the impedance control preset values may be set at from 37 to 45 correspondingly to extinction coefficients of from 0.005 to 0.03 at a wavelength of 550 nm.

Next, setting the impedance control preset value at 40, an absorption type multi-layer film ND filter according to Example 1 was produced which had the multi-layer structure shown in Table 1 and the spectral transmission characteristics shown in FIG. 1.

The absorption type multi-layer film ND filter obtained was left in an environmental tester (manufactured by Espec Corp.) set at 80° C. and 90% to examine their environmental resistance. Then, the ND filter was taken out of the environmental tester on the 24th hour, the 48th hour and the 72nd hour, and its spectral transmission characteristics were measured with an autographic spectrophotometer (manufactured by JASCO Corporation) on lapse of each 24 hours to examine the environmental resistance from their changes with time.

Figure 3:
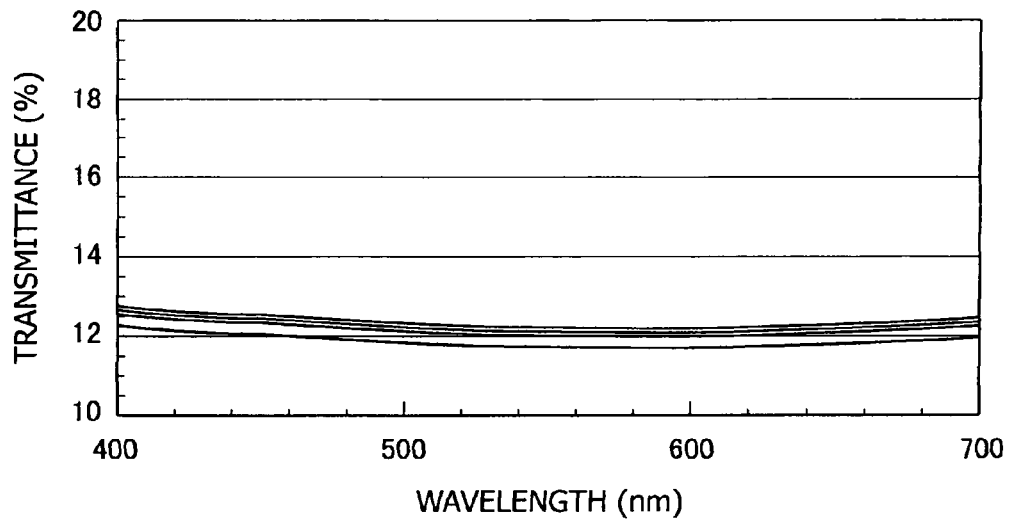
FIG. 3 is a graph showing changes in spectral transmission characteristics in a high-temperature and high-humidity environment, of an absorption type multi-layer film ND filter according to Example 1.

Results obtained are shown in FIG. 3. As is seen from the FIG. 3 graph (in FIG. 3, the filter standing immediately after film formation, after the environmental test for 24 hours, after that for 48 hours and after that for 72 hours corresponds to what is in the order of lower transmittance), the transmittance at a wavelength of 550 nm increased only by about 0.3% at the 24th hour, about 0.4% at the 48th hour and about 0.5% at the 72nd hour even in such a high-temperature and high-humidity environment.

Figure 4:
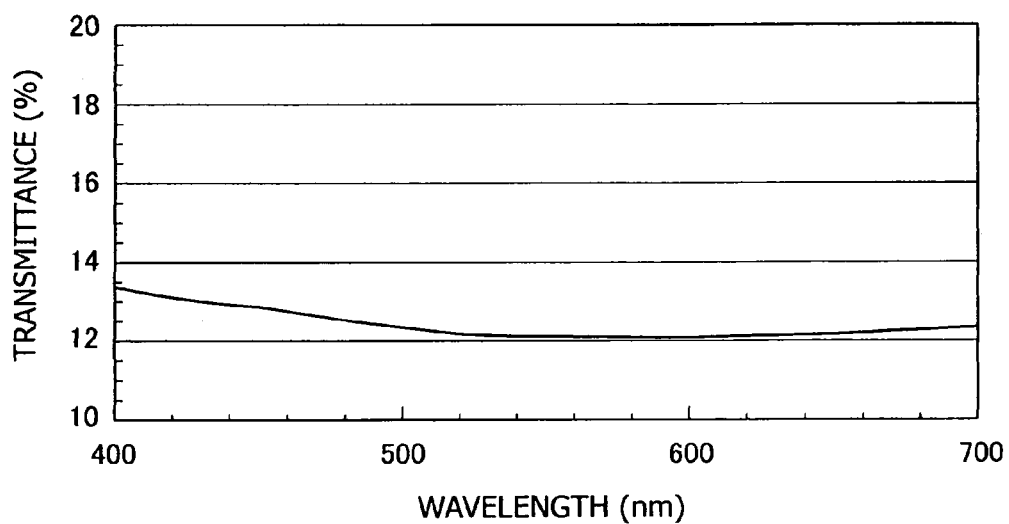
FIG. 4 is a graph showing spectral transmission characteristics of an absorption type multi-layer film ND filter according to Comparative Example.

Meanwhile, using as a film-forming material the target composed chiefly of SiC and Si and, at the time the oxide dielectric film layers were formed, setting the impedance control preset value at 35, at which the SiCyOx films were to be completely oxidized to come into transparent $SiO_2$ films, an absorption type multi-layer film ND filter according to Comparative Example was produced which had the multi-layer structure shown in Table 1 and spectral transmission characteristics shown in FIG. 4.

Here, as is seen from comparison between the spectral transmission characteristics (see FIG. 1) immediately after film formation according to Example 1, in which the impedance control preset value at the time the oxide dielectric film layers were formed was set at 40 (the extinction coefficient of each SiCyOx film at a wavelength of 550 nm was 0.010), and the spectral transmission characteristics (see FIG. 4) immediately after film formation according to Comparative Example, in which the impedance control preset value at the time the oxide dielectric film layers were formed was set at 35 (the extinction coefficient of each SiCyOx film at a wavelength of 550 nm was less than 0.001), the transmittance on the short wavelength side in the visible wavelength region (wavelengths: 400 nm to 700 nm) is lower in the spectral transmission characteristics immediately after film formation according to Example 1 than in the spectral transmission characteristics immediately after film formation according to Comparative Example.

The reason therefor is that, in the absorption type multi-layer film according to Example 1, the oxide dielectric film layers are each constituted of the SiCyOx (0<y≦0.1, 1.5<x<2) film having an extinction coefficient at a wavelength of 550 nm of from 0.005 to 0.05 and hence the oxide dielectric film layers according to Example 1 have larger absorption on the short wavelength side in the visible wavelength region than the oxide dielectric film layers according to Comparative Example. As the result, in the spectral transmission characteristics immediately after film formation according to Example 1, the maximum transmittance in the visible wavelength region is smaller than that in the spectral transmission characteristics immediately after film formation according to Comparative Example, thus the differences in transmittance at individual wavelengths in the visible wavelength region (wavelengths: 400 nm to 700 nm) can be small to bring an improvement in the flatness of spectral transmission characteristics that is defined by the value found where a difference between the maximum transmittance and the minimum transmittance in the visible wavelength region is divided by average transmittance. The flatness of spectral transmission characteristics according to Comparative Example is 10.6 as is seen from FIG. 4, whereas the flatness of spectral transmission characteristics according to Example 1 is 5.8% as being improved (see FIG. 1).

In the above Comparative Example, the impedance control preset value at the time the oxide dielectric film layers are formed is set at 35 (the extinction coefficient of each SiCyOx film at a wavelength of 550 nm is less than 0.001). It has been ascertained that, also where this impedance control preset value is set at 36 (the extinction coefficient of each SiCyOx film at a wavelength of 550 nm is 0.002), the like tendency (i.e., the tendency to a high transmittance on the short wavelength side in the visible wavelength region) is shown as is seen from FIG. 2, and further that the like tendency is shown also where the oxide dielectric film layers are each constituted of an SiCyOx film having an extinction coefficient at a wavelength of 550 nm of less than 0.005.

The absorption type multi-layer film ND filter according to Comparative Example was also left in the environmental tester set at 80° C. and 90% to examine the environmental resistance from its changes with time. Then, the ND filter was taken out of the environmental tester on the 24th hour, the 48th hour and the 72nd hour, and its spectral transmission characteristics were measured with the autographic spectrophotometer on lapse of each 24 hours.

Figure 5:
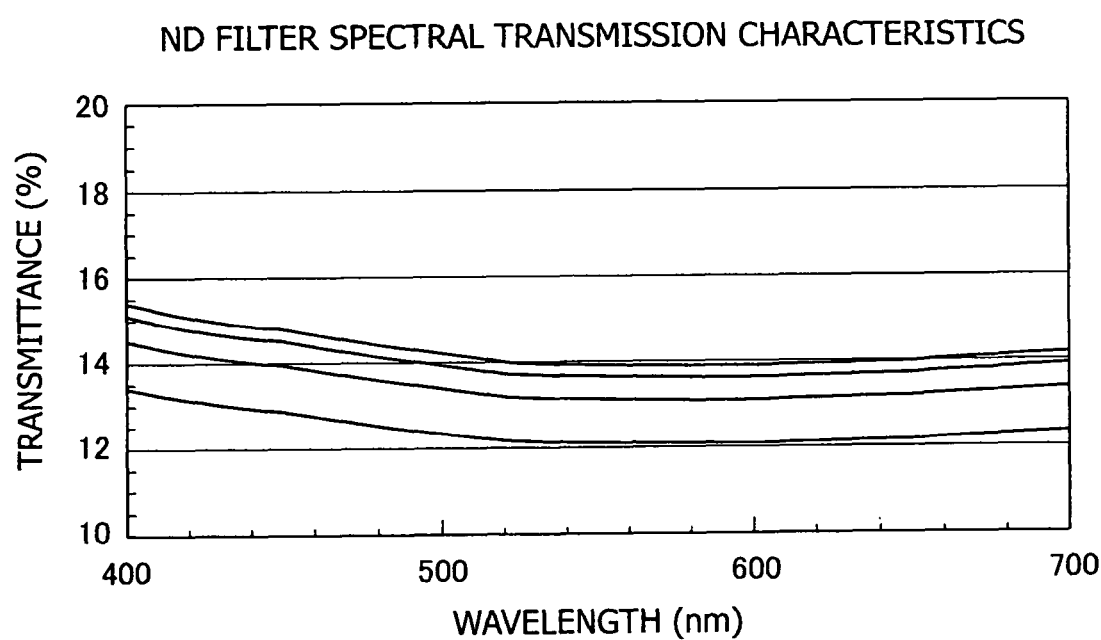
FIG. 5 is a graph showing changes in spectral transmission characteristics in a high-temperature and high-humidity environment, of an absorption type multi-layer film ND filter according to Comparative Example.

Results obtained are shown in FIG. 5. It has been ascertained from the FIG. 5 graph (in FIG. 5, the filter standing immediately after film formation, after the environmental test for 24 hours, after that for 48 hours and after that for 72 hours corresponds to what is in the order of lower transmittance) that the transmittance at a wavelength of 550 nm increases by as much as about 1.0% at the 24th hour, about 1.5% at the 48th hour and about 1.8% at the 72nd hour because of the absorption film layers having been oxidized in such a high-temperature and high-humidity environment.

Thus, it has been ascertained that, in the absorption type multi-layer film ND filter, the SiCyOx (0<y≦0.1, 1.5<x<2) films standing not completely oxidized may be used in the oxide dielectric film layers and this enables the absorption film layers to be kept from being oxidized in a high-temperature and high-humidity environment.

As the reason why the absorption film layers can be kept from being oxidized, it is considered that the SiCyOx (0<y≦0.1, 1.5<x<2) films standing not completely oxidized, having an extinction coefficient at a wavelength of 550 nm of from 0.005 to 0.05, have barrier properties against oxygen and water which are superior to those of SiO$_2$ films standing completely oxidized, and that the SiCyOx films are in such a state that it is difficult for them to feed oxygen to the absorption film layers because they themselves stand short of oxygen.

Example 2

A PET film of 100 μm in thickness which was slit in a width of 300 mm was used as a substrate. In the film formation, a sputtering roll coater system was used. A target composed chiefly of SiC and Si was used as a film-forming material for the SiCyOx films. On this target, sputtering was carried out by dual magnetron sputtering, and the feeding of oxygen was controlled by means of an impedance monitor.

To form on the PET film the absorption type multi-layer film having the film make-up shown in FIG. 1, the PET film was transported at a rate set at about 0.25 m/minute when each SiCyOx (0<y≦0.1, 1.5<x<2) film constituting the oxide dielectric film layers was formed in the layer thickness of 65 nm, and at a rate set at about 1.6 m/minute when it was formed in the layer thickness of 10 nm; and, when each Ti film constituting the absorption film layers was formed in the layer thickness of 15 nm, the PET film was transported at a rate set at about 0.8 m/minute. These PET film transport rates were controlled by micro-adjustment of sputtering electric power so as to afford the layer thicknesses as designed for the films shown in Table 1.

Then, when the SiCyOx (0<y≦0.1, 1.5<x<2) films were formed, the impedance control preset value was continuously changed to form the absorption type multi-layer film to produce an absorption type multi-layer film ND filter according to Example 2. This absorption type multi-layer film ND filter was cut at its portions where the films were each formed at each impedance control preset value, to prepare evaluation samples.

Next, the evaluation samples of the absorption type multi-layer film ND filter according to Example 2 were left in the environmental tester set at the high temperature and high humidity of 80° C. and 90%, and changes with time in spectral transmission characteristics at a wavelength of 550 nm in such environment were measured. Results of evaluation on these are shown in Table 3.

As shown in Table 3, the changes in spectral transmission characteristics as a result of the environmental test become smaller from the time the impedance control preset value has come to be 37 or more, i.e., the extinction coefficient of each SiCyOx (0<y≦0.1, 1.5<x<2) film has come to be 0.005 or more. When the impedance control preset value is 36 or less, the SiCyOx (0<y≦0.1, 1.5<x<2) films formed look transparent in visual observation and hence the films are considered close to SiO$_2$ films having completely been oxidized, thus it is ascertained that the effect of improving the environmental resistance is low.

If the SiCyOx films have an extinction coefficient of more than 0.05, it is difficult to achieve the spectral transmission characteristics which are flat over the visible wavelength region as described above (the differences in transmittance in the visible region is within about 1.5%). It has been ascertained that the SiCyOx films may each preferably have an extinction coefficient of 0.03 or less in order to achieve such flat spectral transmission characteristics.

TABLE 3

| Impedance control preset value | Extinction coefficient of SiCyOx film | Transmittance (%) at wavelength of 550 nm (80° C., 90%) | | | |
|---|---|---|---|---|---|
| | | Immediately after film formation | After 24 hours | After 48 hours | After 72 hours |
| 35 | <0.001 | 12.1 | 13.1 | 13.8 | 14.0 |
| 36 | 0.002 | 12.0 | 13.0 | 13.7 | 13.9 |
| 37 | 0.005 | 11.9 | 12.5 | 12.8 | 13.0 |
| 38 | 0.006 | 11.9 | 12.4 | 12.7 | 12.9 |
| 39 | 0.008 | 11.8 | 12.2 | 12.4 | 12.5 |
| 40 | 0.010 | 11.7 | 12.0 | 12.1 | 12.2 |
| 41 | 0.013 | 11.6 | 11.9 | 12.0 | 12.1 |
| 42 | 0.016 | 11.5 | 11.8 | 11.9 | 12.0 |
| 43 | 0.020 | 11.4 | 11.7 | 11.8 | 11.9 |
| 44 | 0.024 | 11.3 | 11.6 | 11.7 | 11.8 |
| 45 | 0.028 | 11.2 | 11.4 | 11.5 | 11.6 |
| 46 | 0.033 | 11.1 | 11.3 | 11.4 | 11.5 |
| 47 | 0.038 | 10.9 | 11.1 | 11.2 | 11.3 |
| 48 | 0.044 | 10.7 | 10.9 | 11.0 | 11.1 |
| 49 | 0.050 | 10.5 | 10.7 | 10.8 | 10.9 |

Example 3

A PET film of 100 μm in thickness which was slit in a width of 300 mm was used as a substrate. In the film formation, a sputtering roll coater system was used. A target composed chiefly of SiC and Si was used as a film-forming material for the SiCyOx films. On this target, sputtering was carried out by dual magnetron sputtering, and the feeding of oxygen was controlled by means of an impedance monitor.

To form on the PET film the absorption type multi-layer film having a film make-up shown in FIG. 4, the PET film was transported at a rate set at about 0.2 m/minute when each SiCyOx (0<y≦0.1, 1.5<x<2) film constituting the oxide dielectric film layers was formed in the layer thickness of 80 nm, and at a rate set at about 0.8 m/minute when it was formed in the layer thickness of 20 nm; and, when each Ni film constituting the absorption film layers was formed in the layer thickness of 8 nm, the PET film was transported at a rate set at about 0.7 m/minute, and at a rate set at about 0.5 m/minute when it was formed in the layer thickness of 11 nm. These PET film transport rates were controlled by micro-adjustment of sputtering electric power so as to afford the layer thicknesses as designed for the films shown in Table 4.

Then, when the SiCyOx (0<y≦0.1, 1.5<x<2) films were formed, the impedance control preset value was continuously changed to form the absorption type multi-layer film to produce an absorption type multi-layer film ND filter according to Example 3. This absorption type multi-layer film ND filter was cut at its portions where the films were each formed at each impedance control preset value, to prepare evaluation samples.

TABLE 4

| Materials | Layer thickness |
|---|---|
| Medium (air) | — |
| SiCyOx | 80 nm |
| Ni | 8 nm |
| SiCyOx | 80 nm |
| Ni | 11 nm |
| SiCyOx | 80 nm |
| Ni | 8 nm |
| SiCyOx | 20 nm |
| PET | — |

Next, the evaluation samples of the absorption type multi-layer film ND filter according to Example 3 were left in the environmental tester set at the high temperature and high humidity of 80° C. and 90%, and changes with time in spectral transmission characteristics at a wavelength of 550 nm in such environment were measured. Results of evaluation on these are shown in Table 5.

As shown in Table 5, the changes in spectral transmission characteristics as a result of the environmental test become smaller from the time the impedance control preset value has come to be 37 or more, i.e., the extinction coefficient of each SiCyOx ($0<y\leq 0.1$, $1.5<x<2$) film has come to be 0.005 or more. When the impedance control preset value is 36 or less, the SiCyOx ($0<y\leq 0.1$, $1.5<x<2$) films formed look transparent in visual observation and hence the films are considered close to $SiO_2$ films having completely been oxidized, thus it is ascertained that the effect of improving the environmental resistance is low.

TABLE 5

| Impedance control preset value | Extinction coefficient of SiCyOx film | Transmittance (%) at wavelength of 550 nm (80° C., 90%) | | | |
|---|---|---|---|---|---|
| | | Immediately after film formation | After 24 hours | After 48 hours | After 72 hours |
| 35 | <0.001 | 12.5 | 13.5 | 14.3 | 14.5 |
| 36 | 0.002 | 12.5 | 13.5 | 14.2 | 14.4 |
| 37 | 0.005 | 12.4 | 13.0 | 13.3 | 13.5 |
| 38 | 0.006 | 12.3 | 12.8 | 13.1 | 13.3 |
| 39 | 0.008 | 12.2 | 12.6 | 12.8 | 12.9 |
| 40 | 0.010 | 12.2 | 12.5 | 12.5 | 12.7 |
| 41 | 0.013 | 12.0 | 12.3 | 12.4 | 12.5 |
| 42 | 0.016 | 11.9 | 12.2 | 12.0 | 12.4 |
| 43 | 0.020 | 11.8 | 12.1 | 12.2 | 12.3 |
| 44 | 0.024 | 11.7 | 12.0 | 12.1 | 12.2 |
| 45 | 0.028 | 11.5 | 11.7 | 11.8 | 11.9 |
| 46 | 0.033 | 11.3 | 11.5 | 11.7 | 11.8 |
| 47 | 0.038 | 11.1 | 11.3 | 11.4 | 11.5 |
| 48 | 0.044 | 10.9 | 11.0 | 11.1 | 11.1 |
| 49 | 0.050 | 10.6 | 10.7 | 11.7 | 11.8 |

POSSIBILITY OF INDUSTRIAL APPLICATION

As described above, the absorption type multi-layer film ND filter according to the present invention has a possibility of industrial application to compact thin-type digital cameras required to have a long-time reliability in severe environments, because its metal films constituting absorption film layers of the absorption type multi-layer film can not easily be oxidized even in a high-temperature and high-humidity environment.

The invention claimed is:

1. An absorption type multi-layer film neutral density (ND) filter comprising a substrate formed of a resin film and provided on at least one side thereof an absorption type multi-layer film formed of oxide dielectric film layers and absorption film layers which are alternately formed in layers, wherein;
the oxide dielectric film layers are each constituted of an SiCyOx ($0<y\leq 0.1$, $1.5<x<2$) film having an extinction coefficient at a wavelength of 550 nm of 0.005 to 0.05, formed by a physical vapor deposition process making use of a film-forming material composed chiefly of SiC and Si, and the absorption film layers are each constituted of a metal film having a refractive index at a wavelength of 550 nm of 1.5 to 3.0 and an extinction coefficient at that wavelength of 1.5 to 4.0, formed by a physical vapor deposition process; an outermost layer of the absorption type multi-layer film being constituted of one oxide dielectric film layer formed of the SiCyOx film.

2. The absorption type multi-layer film ND filter according to claim 1, wherein flatness of spectral transmission characteristics that is defined by the value found where a difference between the maximum transmittance and the minimum transmittance in the visible wavelength region (wavelengths: 400 nm to 700 nm) is divided by average transmittance is 10% or less.

3. The absorption type multi-layer film ND filter according to claim 1 or 2, wherein a film coming into contact with the substrate of the absorption type multi-layer film is one oxide dielectric film layer formed of the SiCyOx film.

4. The absorption type multi-layer film ND filter according to claim 1 or 2, wherein the oxide dielectric film layers each have a layer thickness of 3 nm to 150 nm.

5. The absorption type multi-layer film ND filter according to claim 1 or 2, wherein the metal film constituting the absorption film layers comprises Ni alone or a Ni-based alloy.

6. The absorption type multi-layer film ND filter according to claim 5, wherein the Ni-based alloy is a Ni-based alloy formed by adding to Ni at least one element selected from Ti, Al, V, W, Ta and Si.

7. The absorption type multi-layer film ND filter according to claim 6, wherein at least one of the Ti element is added in a proportion of 5% by weight to 15% by weight, the Al element is added in a proportion of 3% by weight to 8% by weight, the V element is added in a proportion of 3% by weight to 9% by weight, the W element is added in a proportion of 18% by weight to 32% by weight, the Ta element is added in a proportion of 5% by weight to 12% by weight and the Si element is added in a proportion of 2% by weight to 6% by weight.

8. A process for producing the absorption type multi-layer film ND filter according to claim 1; the process comprising the steps of:
forming an oxide dielectric film layer constituted of an SiCyOx ($0<y\leq 0.1$, $1.5<x<2$) film having an extinction coefficient at a wavelength of 550 nm of 0.005 to 0.05, by a physical vapor deposition process making use of a film-forming material composed chiefly of SiC and Si and the feed rate of oxygen gas in which has been controlled; and
forming an absorption film layer constituted of a metal film having a refractive index at a wavelength of 550 nm of 1.5 to 3.0 and an extinction coefficient at that wavelength of 1.5 to 4.0, by a physical vapor deposition process in which oxygen gas has been stopped to be fed in.

9. The process according to claim 8 for producing the absorption type multi-layer film ND filter, wherein a film coming into contact with a substrate formed of a resin film is formed of the oxide dielectric film layer.

10. The process according to claim 8 or 9 for producing the absorption type multi-layer film ND filter, wherein the oxide dielectric film layer is formed in a layer thickness of 3 nm to 150 nm.

* * * * *